(12) United States Patent
Hagen

(10) Patent No.: US 9,699,924 B2
(45) Date of Patent: Jul. 4, 2017

(54) DISPLAY MOUNT LEVELER

(71) Applicant: Milestone AV Technologies LLC, Eden Prairie, MN (US)

(72) Inventor: Robert Hagen, Minneapolis, MN (US)

(73) Assignee: Milestone AV Technologies LLC, Eden Prairie, MN (US)

( * ) Notice: Subject to any disclaimer, the term of this patent is extended or adjusted under 35 U.S.C. 154(b) by 0 days.

(21) Appl. No.: 14/833,893

(22) Filed: Aug. 24, 2015

(65) Prior Publication Data

US 2016/0106214 A1    Apr. 21, 2016

Related U.S. Application Data

(60) Provisional application No. 62/041,700, filed on Aug. 26, 2014.

(51) Int. Cl.
| | |
|---|---|
| *H05K 5/00* | (2006.01) |
| *H05K 5/02* | (2006.01) |
| *F16M 13/02* | (2006.01) |
| *A47B 96/06* | (2006.01) |

(52) U.S. Cl.
CPC ........... *H05K 5/0221* (2013.01); *F16M 13/02* (2013.01); *H05K 5/0204* (2013.01); *A47B 96/067* (2013.01)

(58) Field of Classification Search
None
See application file for complete search history.

(56) References Cited

U.S. PATENT DOCUMENTS

| | | | | |
|---|---|---|---|---|
| 6,905,101 B1* | 6/2005 | Dittmer | ................... | F16M 11/10 248/125.7 |
| 6,923,413 B2* | 8/2005 | Dozier | ................... | F16M 11/10 248/225.21 |
| 7,404,535 B2* | 7/2008 | Mossman | ............ | F16M 11/041 248/323 |
| 7,441,739 B2* | 10/2008 | Huang | ................... | F16M 13/02 248/292.14 |
| 7,641,163 B2* | 1/2010 | O'Keene | ................ | F16M 11/10 248/284.1 |
| 8,128,049 B2* | 3/2012 | Walters | ................... | F16M 11/10 211/26 |
| 8,235,341 B2* | 8/2012 | Taylor | .................... | F16M 11/10 248/201 |
| 8,235,342 B2* | 8/2012 | Pfister | ................... | F16C 11/103 248/292.14 |
| 8,456,808 B2* | 6/2013 | Grey | ...................... | F16M 11/10 248/201 |

(Continued)

*Primary Examiner* — Courtney Smith
*Assistant Examiner* — Rashen E Morrison
(74) *Attorney, Agent, or Firm* — Patterson Thuente Pedersen, P.A.

(57) ABSTRACT

A display mount for an electronic display. The mount includes a support bracket adapted to be secured to a wall or similar structure, and a display bracket adapted to be secured to an electronic display. The support bracket includes a plurality of pairs of angled slots, each pair of angled slots having a different angle than the other pairs. The slots receive fasteners which secure the support bracket to the wall, as well as provide a means for adjusting the tilt of the bracket so as to ensure the bracket is level. The display bracket is attachable to a display, and a structure adapted to cooperate with a corresponding structure on the support bracket to hang the display from the support bracket.

12 Claims, 6 Drawing Sheets

(56) References Cited

U.S. PATENT DOCUMENTS

| | | | | |
|---|---|---|---|---|
| 2003/0201372 | A1* | 10/2003 | Dozier | F16M 11/10 248/286.1 |
| 2004/0118987 | A1* | 6/2004 | Matko | B60R 11/0235 248/282.1 |
| 2004/0245420 | A1* | 12/2004 | Pfister | F16C 11/103 248/289.11 |
| 2006/0065800 | A1* | 3/2006 | Bremmon | F16M 11/10 248/274.1 |
| 2006/0231711 | A1* | 10/2006 | Shin | F16M 11/10 248/291.1 |
| 2007/0258196 | A1* | 11/2007 | Koskinen | F16M 13/02 361/679.01 |
| 2008/0237426 | A1* | 10/2008 | Walters | F16M 11/10 248/316.8 |
| 2010/0091438 | A1* | 4/2010 | Dittmer | F16M 11/10 361/679.01 |
| 2011/0002110 | A1* | 1/2011 | Skull | B32B 27/08 361/825 |
| 2011/0198460 | A1* | 8/2011 | Stifal | F16M 11/10 248/201 |
| 2012/0250233 | A1* | 10/2012 | Lee | F16M 11/10 361/679.01 |
| 2013/0048812 | A1* | 2/2013 | Lozano | H05K 5/0204 248/220.22 |

* cited by examiner

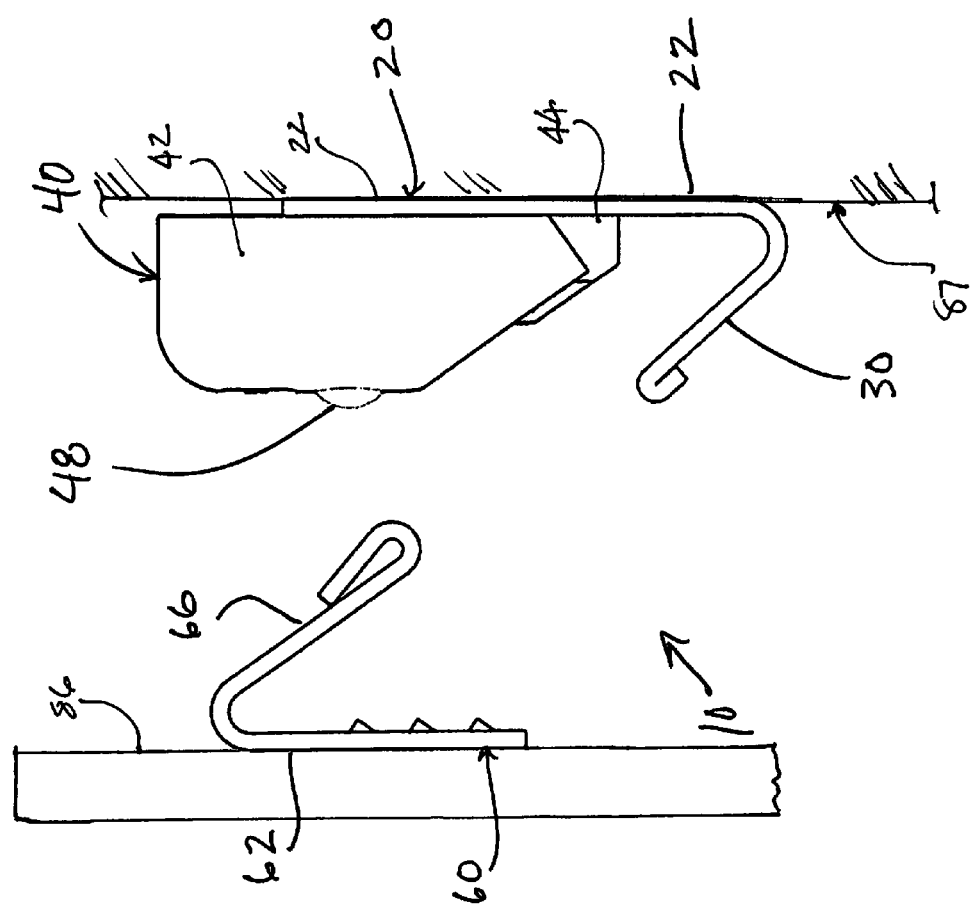

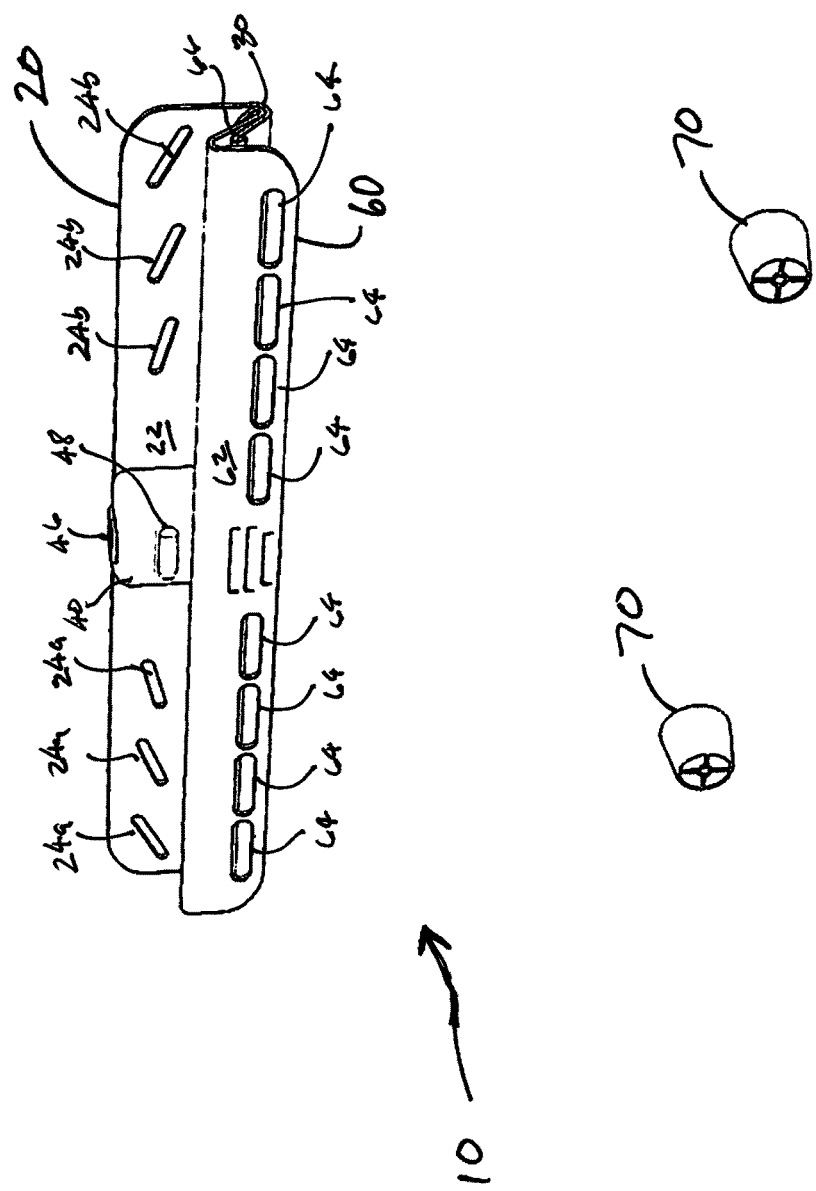

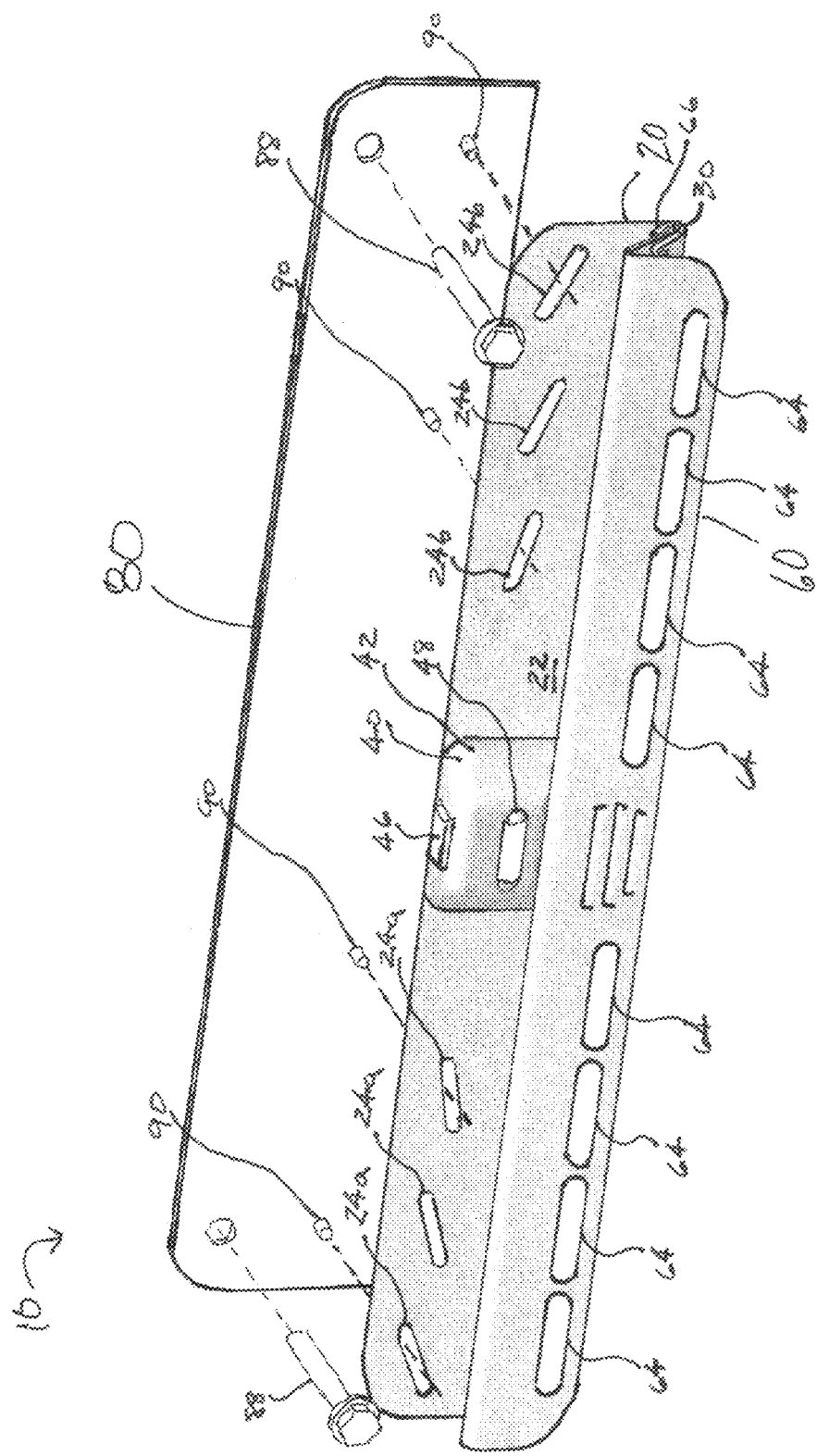

DISPLAY MOUNT LEVELER

RELATED APPLICATION

The present application claims the benefit of U.S. Provisional Application No. 62/041,700, filed Aug. 26, 2014, said application being hereby incorporated herein in its entirety by reference.

FIELD OF THE INVENTION

The present invention relates generally to mounts for flat panel electronic display devices and more specifically to installation systems and methods for flat panel electronic display mounts.

BACKGROUND OF THE INVENTION

Flat panel monitors and televisions have become highly popular and widely used throughout commercial, business, and residential environments. These flat panel displays enable an enhanced viewing experience with layout versatility, space savings, and the ability to replace bulky computer monitors and televisions with displays that are merely a fraction of the depth and weight of similar prior displays of identical screen size.

A desirable quality for flat panel display mounting devices is the ability to maintain the display in a level condition relative to the floor or ground. A level display is not only desirable from an aesthetic standpoint, but also functionally. Particularly for mounts enabling positional adjustment of the display, undesirable stresses can be places on the mount and structure to which the mount is attached if the display is out-of-level. Also, the display can be more difficult to positionally adjust if out-of-level due to an uneven weight distribution.

Mounting devices are typically to attached to a wall or other structure using one or more mechanical fastening members. Where structural elements such as studs are advantageously positioned, lag bolts or screws are often used to fasten the mounting device to the structure. In other cases where a mount is to be fastened to drywall or plaster wall where studs are not available, toggle bolts or drywall anchors may be used.

A problem that often arises when fastening these existing display mounts to the structure is that the mount will shift position slightly when the fastening members are tightened. That is, the mount is initially positioned in a level condition, but as the lag screws, toggles, or anchors are fully tightened, the mount may rotate slightly out-of-level. While the out-of-level condition is often not apparent immediately, it becomes evident once the display is attached to the mount. It is typically very difficult to reposition the mount by loosening and retightening the fastening members, since the mount tends to shift every time the fastening members are tightened. Also, such a trial-and-error process is often time consuming and may add to the cost of installation.

Therefore, there is a need for a display mount which allows for faster, easier leveling of the mount and display.

SUMMARY OF THE INVENTION

The present invention is directed to a display mount for an electronic display. The mount generally includes a support bracket adapted to be secured to a wall or similar structure, and a display bracket adapted to be secured to an electronic display. The support bracket generally includes a plurality of pairs of angled slots, each pair of angled slots having a different angle than the other pairs. The slots are adapted to receive fasteners which secure the support bracket to the wall, as well as provide a means for adjusting the tilt of the bracket so as to ensure the bracket is level. The support bracket also includes a structure adapted to cooperate with a corresponding structure on the display bracket to allow the display bracket to be adjustably and removably coupled with the support bracket. The support bracket may also include a releasable latch to retain the display bracket in place. The display bracket generally includes a means for securing the display bracket to a display, and a structure adapted to cooperate with a corresponding structure on the support bracket.

In another embodiment, the display mount further includes a mounting plate adapted to be secured directly to a wall or other similar structure. In such an embodiment, the support bracket is secured to the mounting plate by way of a plurality of studs or standoffs or similar fasteners. Such an arrangement allows the spacing of the fasteners for the mounting plate to be easily matched to the spacing of, for example, wall studs to which the mounting plate is secured.

In an embodiment, a mount for a flat panel electronic display device includes a support bracket adapted to attach to a wall of a structure. The support bracket has a planar mounting portion and a cleat portion extending outwardly therefrom. The mounting portion defines a first pair of opposing angled slots, each slot of the pair of slots disposed equidistant from a center of the mounting portion, the slots oriented such that when fasteners are received through the slots to mount the support bracket to the wall, the support bracket is shiftable to enable leveling of the support bracket by sliding of the fasteners in the slots. A display bracket is adapted to attach to the flat panel electronic display device, the display bracket comprising a planar display interface portion and a cleat portion extending therefrom, wherein the cleat portion of the display bracket is selectively engageable with the cleat portion of the support bracket to hang the flat panel electronic display device on the wall.

In an embodiment, the mounting portion defines a second pair of opposing angled slots, each slot of the second pair of slots disposed equidistant from a center of the mounting portion, the slots oriented such that when fasteners are received through the slots to mount the support bracket to the wall, the support bracket is shiftable to enable leveling of the support bracket by sliding of the fasteners in the slots.

In an embodiment, the orientation of the first and second pairs of slots is such that a straight line drawn through the uppermost portion of the slots on one side of the center of the mounting portion intersects the lowermost portion of the slots on the other side of the center of the mounting portion.

In embodiments, the support bracket further includes a latch mechanism for latching the display bracket to the support bracket. In embodiments the support bracket further includes a bubble level.

In further embodiments, the mount includes a mounting plate having a plurality of PEM studs, the PEM studs being received through the slots of the support bracket.

In further embodiments, the mount includes a plurality of standoffs adapted to attach to the flat panel electronic display device.

In still further embodiments, an electronic display system includes a flat panel electronic display device, and a support bracket adapted to attach to a wall of a structure. The support bracket includes a planar mounting portion and a cleat portion extending outwardly therefrom. The mounting portion defines a first pair of opposing angled slots, each slot of the pair of slots disposed equidistant from a center of the mounting portion, the slots oriented such that when fasteners are received through the slots to mount the support bracket to the wall, the support bracket is shiftable to enable leveling of the support bracket by sliding of the fasteners in the slots. The system includes a display bracket attached to the flat panel electronic display device, the display bracket comprising a planar display interface portion and a cleat portion extending therefrom, wherein the cleat portion of the display bracket is selectively engageable with the cleat portion of the support bracket to hang the flat panel electronic display device on the wall.

In an embodiment of the electronic display system, the mounting portion defines a second pair of opposing angled slots, each slot of the second pair of slots disposed equidistant from a center of the mounting portion, the slots oriented such that when fasteners are received through the slots to mount the support bracket to the wall, the support bracket is shiftable to enable leveling of the support bracket by sliding of the fasteners in the slots. In embodiments, the orientation of the first and second pairs of slots is such that a straight line drawn through the uppermost portion of the slots on one side of the center of the mounting portion intersects the lowermost portion of the slots on the other side of the center of the mounting portion.

In embodiments of the electronic display system, the support bracket further includes a latch mechanism for latching the display bracket to the support bracket. The support bracket may further include a bubble level. The system may further include a mounting plate having a plurality of PEM studs, the PEM studs being received through the slots of the support bracket. The electronic display system may further include a plurality of standoffs adapted to attach to the flat panel electronic display device.

In still further embodiments, a method of mounting a flat panel electronic display on a wall includes attaching a support bracket to the wall, the support bracket including a planar mounting portion and a cleat portion extending outwardly therefrom, the mounting portion defining a first pair of opposing angled slots, each slot of the pair of slots disposed equidistant from a center of the mounting portion, the support bracket being attached to the wall with fasteners though the slots, levelling the support bracket on the wall by sliding the slots relative to the fasteners in the slots, tightening the fasteners to secure the support bracket in place on the wall. The method further includes a display bracket adapted to the flat panel electronic display device, the display bracket comprising a planar display interface portion and a cleat portion extending therefrom, and engaging the cleat portion of the display bracket with the cleat portion of the support bracket to hang the flat panel electronic display device on the wall.

BRIEF DESCRIPTION OF THE DRAWINGS

The embodiments of the present invention may be more completely understood in consideration of the following detailed description of various embodiments of the invention in connection with the accompanying drawings, in which:

FIG. 3 is a side elevation view of the display mount of FIG. 2 with a flat panel electronic display device attached;

FIG. 4 is another perspective view of a display mount according to an embodiment of the invention; and FIG. 5 is a perspective view of a display mount according to another embodiment of the invention.

Figure 1:
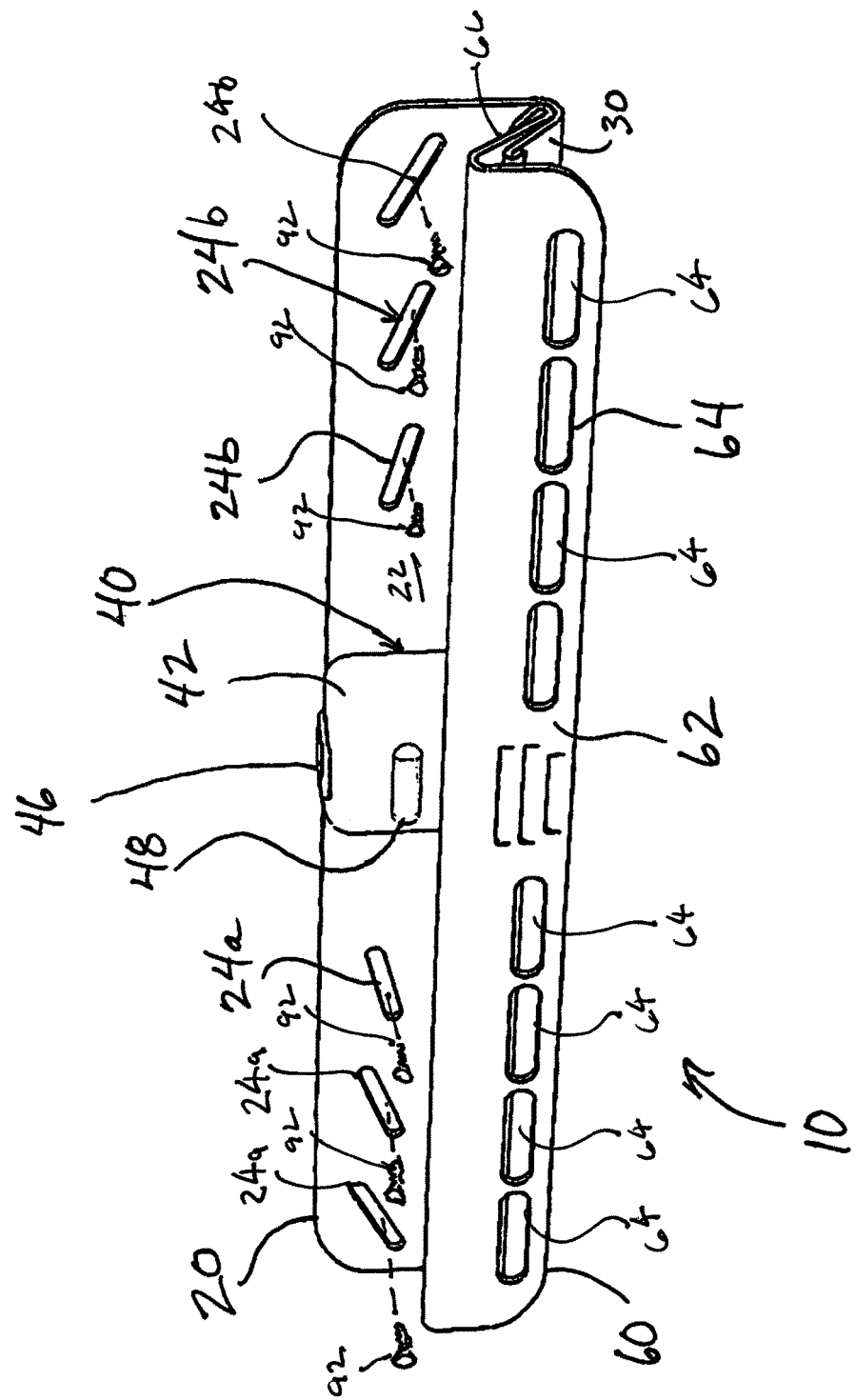
FIG. 1 is a perspective view of a display mount according to an embodiment of the invention.

While the present invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE DRAWINGS

Referring to FIGS. 1-5, display mount 10 generally includes a support bracket 20 and a display bracket 60. Support bracket 20 includes a mounting portion 22 configured to be placed against a wall or other suitable mounting surface or structure. Mounting portion 22 defines a plurality of slots 24 for receiving nails, screws, rivets, bolts, or other fastening means for securing the support bracket 20 to the wall. Although depicted as straight, slots 24 can be a variety of different sizes and shapes to accommodate different fastening means, and rotation of support bracket 20 to accommodate post-installation levelling. Slots 24 may be provided in pairs, such as 24a and 24b, disposed on opposite sides of mounting portion center 25, wherein the slot 24a is arranged at an angle which is the mirror image of the angle of slot 24b, and vice-versa.

Figure 1A:
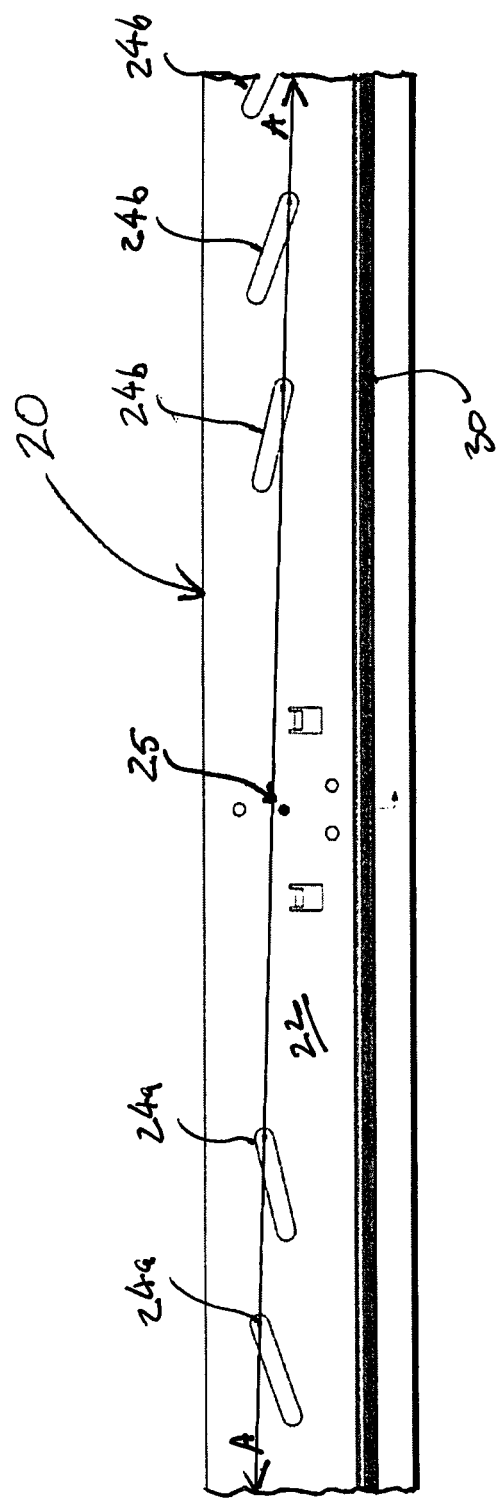
FIG. 1A is a front detail view of a support portion of the display mount of FIG. 1, with a line drawn thereon to depict the alignment of the slots.
Figure 2:
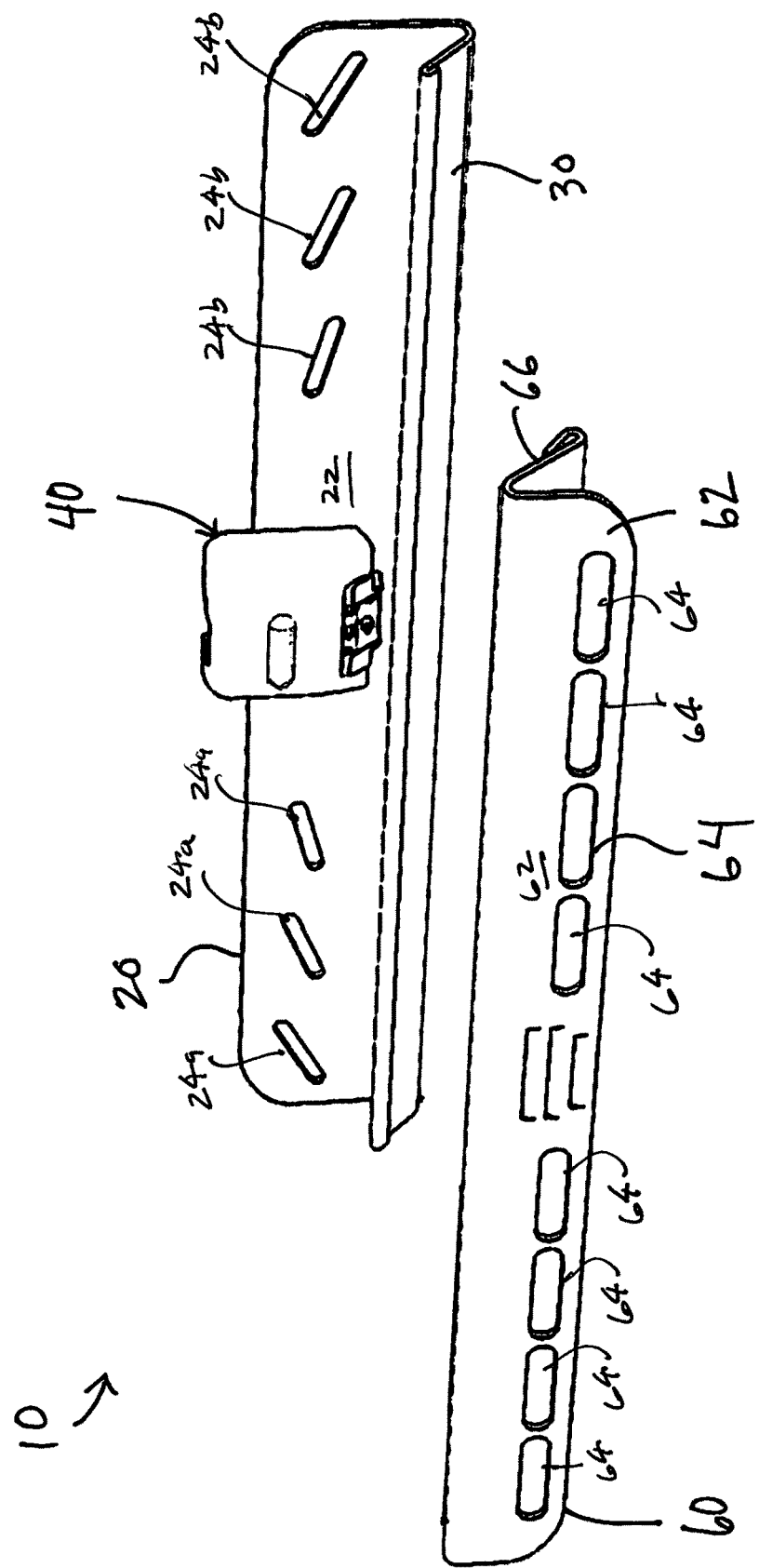
FIG. 2 is an exploded perspective view of the display mount of FIG. 1.

Although the Figures generally depict three pairs of slots 24, other arrangements are within the scope of the invention and may be varied as necessary, for example additional pairs of slots may be added to accommodate larger, heavier displays while fewer slots may be satisfactory for smaller, lighter displays. The spacing of at least one of the pairs of slots may be selected so as to conform to common spacing of wall supports, for example sixteen inch spacing as may be used in residential construction, or twenty-four inch spacing as may be used in commercial construction. As depicted in FIG. 1A, the orientation of the pairs of slots is such that a line A-A can be drawn through the uppermost portion of the slots 24a on one side of support bracket 20 through the lowermost portion of the slots 24b on the other side of bracket 20. Thus, the configuration of slots 24 is such that support bracket 20 can be rotated to be made level, even with the use of three or more fasteners.

Support bracket 20 further includes a cleat portion 30, configured to cooperate with a corresponding structure on display bracket 60, as described in further detail below. Support bracket 20 may also include a latching mechanism 40 having a housing 42, a latch 44 and a release 46. Display mount 10 may be configured such that when display bracket 60 is latched, bracket 60 is free to translate in a horizontal direction so as to allow additional positioning adjustment of the display subsequent to support bracket 20 being secured in place. Alternately, display mount 10 may be configured such that display bracket 60 is locked in place when latched. A bubble level 48 may be provided on housing 42, or elsewhere on display mount 10, to aid in positioning display mount 10.

Display bracket 60 generally includes a display surface 62 configured to be secured against the back-side of flat panel electronic display device 86. Display surface 62 defines a plurality of slots or apertures 64. These slots or apertures 64 can be made in a variety of different sizes and shapes as may be suitable to accommodate different fastening means. The spacing, configuration and/or arrangement of slots 64 may be selected to comply with one or more mounting interface standards, such as those promulgated by VESA. Display bracket 60 further includes a cleat portion 66 configured to cooperate with a corresponding cleat portion 30 on support bracket 20 similar to a French cleat arrangement, so as to allow display bracket 60 to hang from support bracket 20.

Display mount 10 may also include one or more standoffs 70, sized and configured to be coupled or otherwise secured to display device 86 below display mount 10, so as to enable display device 86 to be generally parallel with wall 87 or other mounting structure to which display mount 10 is affixed. Typically, display devices 86 include a plurality of configurations for securing the display to a mount or other structure, and are provided with threaded inserts which may be constructed of ferromagnetic materials. Standoffs 70 may therefore include a magnetic portion so to cooperate with the inserts provided on the rear of displays, or standoffs 70 may be threaded so as to thread into the inserts. Alternately, standoffs 70 may include an adhesive portion to attach to the rear of the display.

To install display mount 10, support bracket 20 is positioned into place, and at least partially retained in place with fasteners 92 through slots 24*a*, 24*b*. Using bubble level 48, support bracket 20 can be rotated level by sliding slots 24*a*, 24*b*, over fasteners 92. Afterward, fasteners 92 can be tightened to fix support bracket 20 in position. Display bracket 60 is secured to display 86 with fasteners (not depicted) through slots 64, and one or more of standoffs 70 can be positioned on display 86. Cleat portion 66 is hung on cleat portion 30 of support bracket 20, and latching mechanism 40 may be manually or automatically actuated to secured display bracket 60 to support bracket 20. If additional leveling adjustments are necessary, one or more of fasteners 92 holding support bracket 20 to the wall may be loosened, allowing rotation of support bracket 20 into level, and fasteners 92 retightened.

Referring now to FIG. 5, in an alternate embodiment, a separate mounting plate 80 is provided as part of display mount 10. Plate 80 is secured to the wall or other structure with lag bolts 85 or other suitable fasteners, and support bracket 20 is then secured to plate 80 by way of PEM studs 90 or threaded fasteners through slots 24*a*, 24*b*. Support bracket 20 can then be leveled by rotating support bracket 20 as described above, while plate 80 remains in place on the wall.

Although specific examples have been illustrated and described herein, it will be appreciated by those of ordinary skill in the art that any arrangement calculated to achieve the same purpose could be substituted for the specific examples shown. This application is intended to cover adaptations or variations of the present subject matter. Therefore, it is intended that the invention be defined by the attached claims and their legal equivalents, as well as the following illustrative embodiments.

The invention claimed is:

1. A mount for a flat panel electronic display device, the mount comprising:
   a support bracket adapted to attach to a wall of a structure, the support bracket comprising a planar mounting portion and a cleat portion extending outwardly therefrom, the mounting portion defining a first pair of opposing slots angled relative to a vertical direction at a first angle, each slot of the first pair of slots disposed equidistant from a center of the mounting portion, the mounting portion defining a second pair of opposing slots angled relative to the vertical direction at a second angle different from the first angle, each slot of the second pair of slots disposed equidistant from a center of the mounting portion, the slots of the first pair of slots and the slots of the second pair of slots oriented such that when fasteners are received through the slots of the first pair of slots or the slots of the second pair of slots to mount the support bracket to the wall, the support bracket is shiftable to enable leveling of the support bracket by sliding of the fasteners in the slots; and
   a display bracket adapted to attach to the flat panel electronic display device, the display bracket comprising a planar display interface portion and a cleat portion extending therefrom, wherein the cleat portion of the display bracket is selectively engageable with the cleat portion of the support bracket to hang the flat panel electronic display device on the wall.

2. The mount of claim 1, wherein the orientation of the first, and second pairs of slots is such that a straight line drawn through the uppermost portion of the slots on one side of the center of the mounting portion intersects the lowermost portion of the slots on the other side of the center of the mounting portion.

3. The mount of claim 1, wherein the support bracket further comprises a latch mechanism for latching the display bracket to the support bracket.

4. The mount of claim 1, wherein the support bracket further comprises a bubble level.

5. The mount of claim 1, further comprising a mounting plate having a plurality of PEM studs, the PEM studs being received through the slots of the support bracket.

6. The mount of claim 1, further comprising a plurality of standoffs adapted to attach to the flat panel electronic display device.

7. An electronic display system comprising:
   a flat panel electronic display device;
   a support bracket adapted to attach to a wall of a structure, the support bracket comprising a planar mounting portion and a cleat portion extending outwardly therefrom, the mounting portion defining a first pair of opposing slots angled relative to a vertical direction at a first angle, each slot of the first pair of slots disposed equidistant from a center of the mounting portion, the mounting portion defining a second pair of opposing slots angled relative to the vertical direction at a second angle different from the first angle, each slot of the second pair of slots disposed equidistant from a center of the mounting portion, the slots of the first pair of slots and the slots of the second pair of slots oriented such that when fasteners are received through the slots of the first pair of slots or the slots of the second pair of slots to mount the support bracket to the wall, the support bracket is shiftable to enable leveling of the support bracket by sliding of the fasteners in the slots; and
   a display bracket attached to the flat panel electronic display device, the display bracket comprising a planar display interface portion and a cleat portion extending therefrom, wherein the cleat portion of the display bracket is selectively engageable with the cleat portion of the support bracket to hang the flat panel electronic display device on the wall.

8. The electronic display system of claim 1, wherein the orientation of the first and second pairs of slots is such that a straight line drawn through the uppermost portion of the slots on one side of the center of the mounting portion intersects the lowermost portion of the slots on the other side of the center of the mounting portion.

9. The electronic display system of claim 7, wherein the support bracket further comprises a latch mechanism for latching the display bracket to the support bracket.

10. The electronic display system of claim 7, wherein the support bracket further comprises a bubble level.

11. The electronic display system of claim 7, further comprising a Mounting plate having a plurality of PEM studs, the PEM studs being received through the slots of the support bracket.

12. The electronic display system of claim 1, further comprising a plurality of standoffs adapted to attach to the flat panel electronic display device.

* * * * *